(12) United States Patent
Fujimoto

(10) Patent No.: US 12,292,590 B2
(45) Date of Patent: May 6, 2025

(54) LIGHT SOURCE MODULE

(71) Applicant: KYOCERA Corporation, Kyoto (JP)

(72) Inventor: Yasuhiro Fujimoto, Setouchi (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 18/564,408

(22) PCT Filed: May 25, 2022

(86) PCT No.: PCT/JP2022/021443
§ 371 (c)(1),
(2) Date: Nov. 27, 2023

(87) PCT Pub. No.: WO2022/250092
PCT Pub. Date: Dec. 1, 2022

(65) Prior Publication Data
US 2024/0255686 A1     Aug. 1, 2024

(30) Foreign Application Priority Data
May 28, 2021  (JP) .................................. 2021-090062

(51) Int. Cl.
*F21V 8/00*     (2006.01)
(52) U.S. Cl.
CPC ......... *G02B 6/0006* (2013.01); *G02B 6/0008* (2013.01)

(58) Field of Classification Search
CPC ............................. G02B 6/0006; G02B 6/0008
See application file for complete search history.

(56) References Cited

U.S. PATENT DOCUMENTS

| 2003/0147254 A1* | 8/2003 | Yoneda ................ G02B 6/4298 362/555 |
| 2022/0390689 A1 | 12/2022 | Itakura | |

FOREIGN PATENT DOCUMENTS

| JP | 62-183405 A | | 8/1987 | |
| JP | 2005-70573 A | | 3/2005 | |
| JP | 2005266657 A | * | 9/2005 | .............. G02B 6/12 |
| JP | 2020-194071 A | | 12/2020 | |
| WO | 2021/065948 A1 | | 4/2021 | |

\* cited by examiner

*Primary Examiner* — Donald L Raleigh
(74) *Attorney, Agent, or Firm* — Volpe Koenig

(57) ABSTRACT

A light source module includes a first light emitter, a second light emitter, and a third light emitter each to emit light with a different wavelength, a cladding, and a core in the cladding. The core includes a first waveguide, a second waveguide, a third waveguide, a merging portion in which at least two waveguides of the first waveguide, the second waveguide, or the third waveguide merge, and an emission portion at one end of the merging portion. Each of the at least two waveguides includes a first portion that receives incident light and a second portion adjacent to the merging portion. The first portion has a greater width than the second portion.

20 Claims, 5 Drawing Sheets

LIGHT SOURCE MODULE

TECHNICAL FIELD

The present disclosure relates to a light source module.

BACKGROUND OF INVENTION

A known technique is described in, for example, Patent Literature 1.

CITATION LIST

Patent Literature

Patent Literature 1: Japanese Unexamined Patent Application Publication No. 62-183405

SUMMARY

In one or more aspects of the present disclosure, a light source module includes a first light emitter that emits light with a first wavelength, a second light emitter that emits light with a second wavelength different from the first wavelength, a third light emitter that emits light with a third wavelength different from the first wavelength and the second wavelength, a cladding, and a core in the cladding. The core includes a first waveguide that transmits light emitted from the first light emitter, a second waveguide that transmits light emitted from the second light emitter, a third waveguide that transmits light emitted from the third light emitter, a merging portion in which at least two waveguides of the first waveguide, the second waveguide, or the third waveguide merge, and an emission portion at one end of the merging portion. Each of the at least two waveguides includes a first portion that receives incident light and a second portion adjacent to the merging portion. The first portion has a greater width than the second portion.

DESCRIPTION OF EMBODIMENTS

The objects, features, and advantages of the present disclosure will be more apparent from the following detailed description and the drawings.

Various display devices and light source modules for display devices have been developed for projecting images onto, for example, a display screen using two-dimensional scanning of laser light. Patent Literature 1 describes an optical waveguide circuit including a tapered waveguide for such light source modules.

A light source module is to cause light emitted from a light emitter to efficiently enter a waveguide.

A light source module according to one or more embodiments of the present disclosure will now be described with reference to the accompanying drawings. The drawings used herein are schematic and are not drawn to scale relative to the actual size of each component. Although the light source module according to one or more embodiments of the present disclosure may be oriented with any sides being upward or downward, the light source module herein is defined using the orthogonal coordinate system (X, Y, and Z) for convenience, with its positive Z-direction being upward to have an upper surface or a lower surface.

Figure 1:
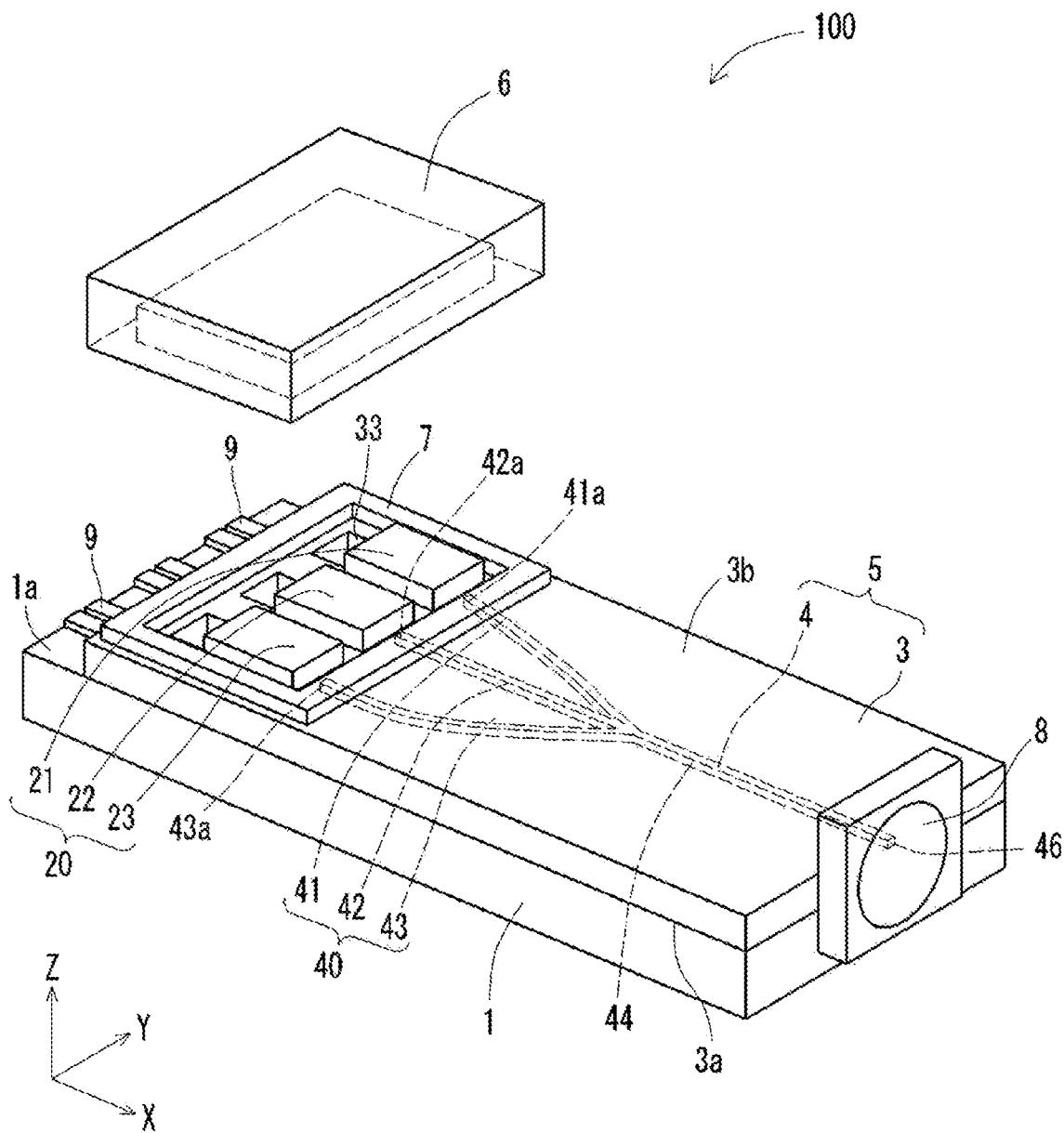
FIG. 1 is an exploded perspective view of a light source module according to an embodiment of the present disclosure.
Figure 2:
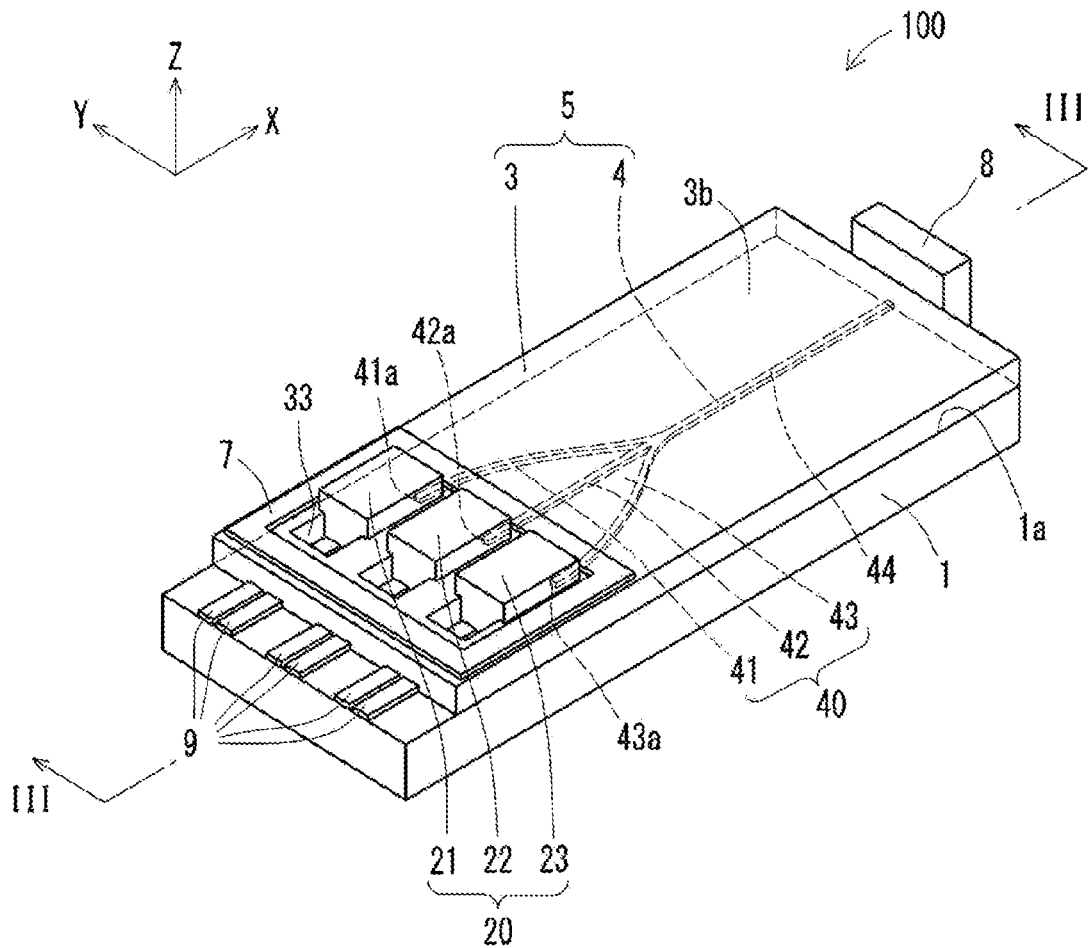
FIG. 2 is a perspective view of the light source module in FIG. 1 without illustrating a lid.
Figure 3:
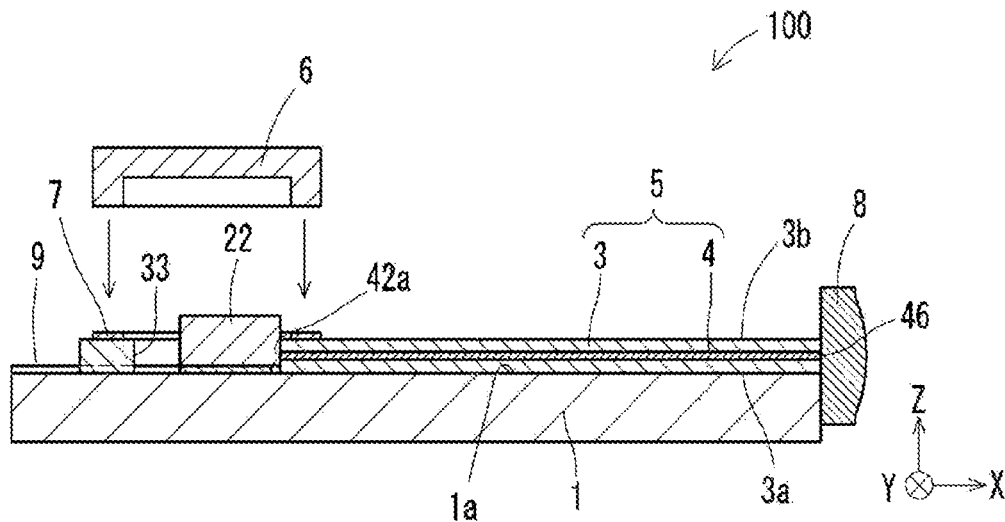
FIG. 3 is a cross-sectional view taken along line III-III in FIG. 2.
Figure 4:
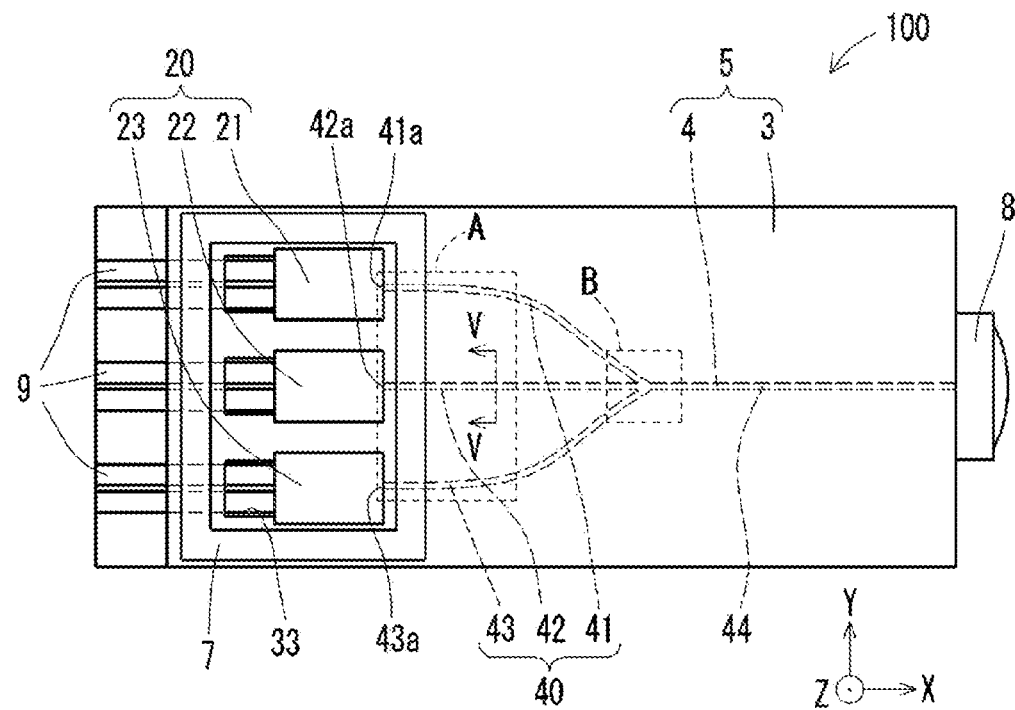
FIG. 4 is a plan view of the light source module in FIG. 1.
Figure 5:
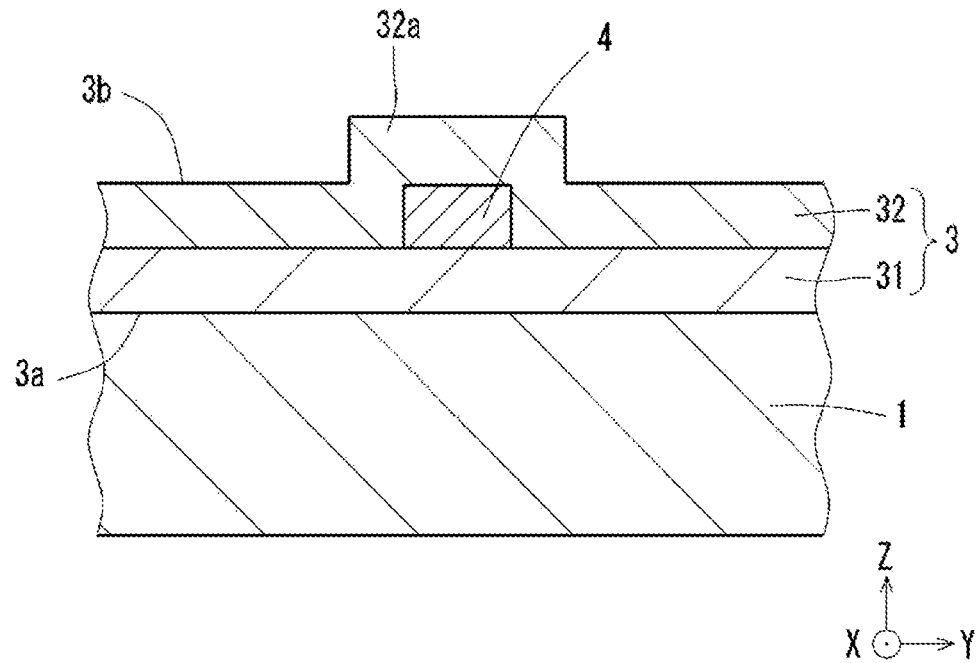
FIG. 5 is an end view taken along line V-V in FIG. 4.
Figure 6:
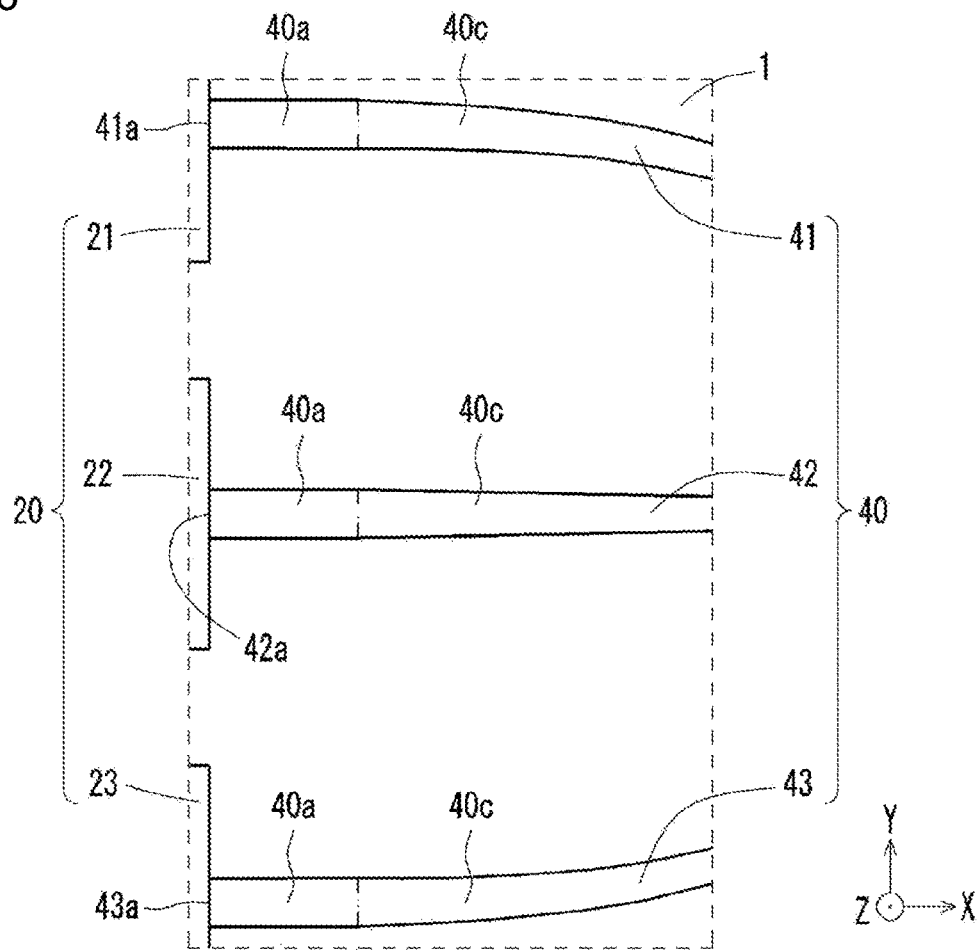
FIG. 6 is a plan view of the light source module in FIG. 1 illustrating its main part in an enlarged manner.
Figure 7:
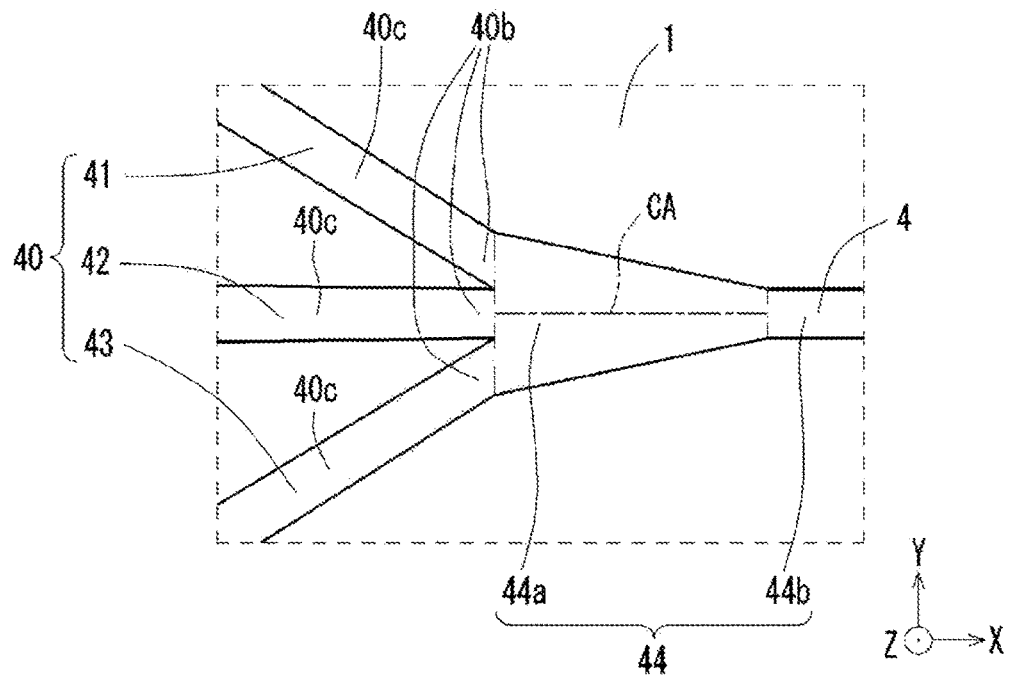
FIG. 7 is a plan view of the light source module in FIG. 1 illustrating its main part in an enlarged manner.
Figure 8:
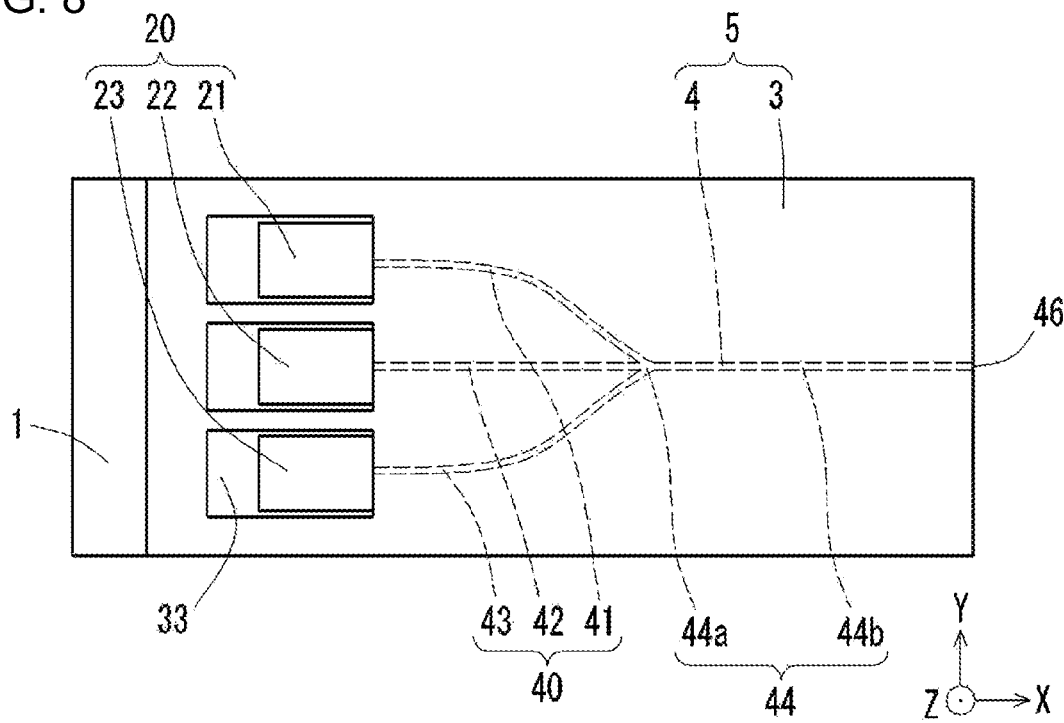
FIG. 8 is a plan view of a light source module according to an embodiment of the present disclosure.
Figure 9:
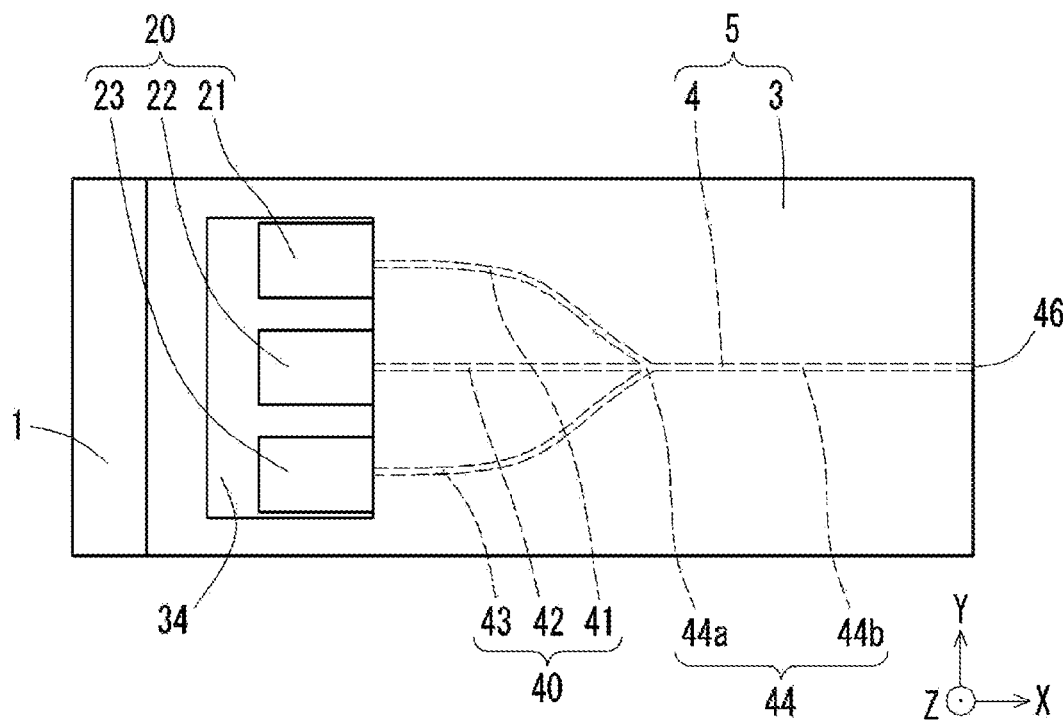
FIG. 9 is a plan view of a light source module according to a variation of the embodiment of the present disclosure.

FIG. 1 is an exploded perspective view of a light source module according to an embodiment of the present disclosure. FIG. 2 is a perspective view of the light source module in FIG. 1 without illustrating a lid. FIG. 3 is a cross-sectional view taken along line III-III in FIG. 2. FIG. 4 is a plan view of the light source module in FIG. 1. FIG. 5 is an end view taken along line V-V in FIG. 4. FIGS. 6 and 7 are plan views of the light source module in FIG. 1 illustrating its main parts in an enlarged manner. FIG. 8 is a plan view of a light source module according to an embodiment of the present disclosure. FIG. 9 is a plan view of a light source module according to a variation of the embodiment of the present disclosure. FIG. 2 is a perspective view as viewed in a direction different from FIG. 1. FIG. 4 does not illustrate the lid. FIG. 6 is an enlarged view of part A in FIG. 4. FIG. 7 is an enlarged view of part B in FIG. 4. FIGS. 6 and 7 illustrate a first light emitter, a second light emitter, a third light emitter, a core, and a substrate. The other components of the light source module are not illustrated in the figures. FIGS. 8 and 9 illustrate the first light emitter, the second light emitter, the third light emitter, a cladding, the core, and the substrate. The other components of the light source module are not illustrated in the figures.

In the present embodiment, a light source module 100 includes a first light emitter 21, a second light emitter 22, a third light emitter 23, a cladding 3, and a core 4.

The first light emitter 21, the second light emitter 22, and the third light emitter 23 may be, for example, semiconductor lasers or light-emitting diodes. In the example described below, the first light emitter 21, the second light emitter 22, and the third light emitter 23 are semiconductor lasers. The first light emitter 21, the second light emitter 22, and the third light emitter 23 may not be distinguished from one another and may be collectively referred to as light emitters 20.

The first light emitter 21 emits light with a first wavelength at a peak of the light intensity. The second light emitter 22 emits light with a second wavelength at a peak of the light intensity. The third light emitter 23 emits light with a third wavelength at a peak of the light intensity. The first wavelength, the second wavelength, and the third wavelength differ from one another.

The second wavelength may be, for example, longer than the first wavelength. The third wavelength may be, for example, longer than the second wavelength. The first wavelength may be in a wavelength region of about 400 to 500 nm. The first light emitter 21 that emits light in this wavelength region may be a blue semiconductor laser. The second wavelength may be in a wavelength region of about 500 to 600 nm. The second light emitter 22 that emits light in this wavelength region may be a green semiconductor laser. The third wavelength may be in a wavelength region of about 600 to 700 nm. The third light emitter 23 that emits light in this wavelength region may be a red semiconductor laser. In the example below, the second wavelength is longer than the first wavelength, and the third wavelength is longer than the second wavelength. In this example, the first light emitter 21 is a blue semiconductor laser, the second light emitter 22 is a green semiconductor laser, and the third light emitter 23 is a red semiconductor laser.

The first light emitter 21 and the second light emitter 22 may each have, for example, a length of about 500 to 700 μm, a width of about 100 to 400 μm, and a height of about 50 to 150 μm. The third light emitter 23 may have, for example, a length of about 200 to 400 μm, a width of about 100 to 300 μm, and a height of about 50 to 150 μm.

An optical waveguide layer 5 includes the cladding 3 and the core 4. As illustrated in, for example, FIGS. 1 to 5, the core 4 is located in the cladding 3. The light source module 100 may include a substrate 1. In this case, the cladding 3 may be located on a first surface 1a of the substrate 1, and the core 4 may extend along the first surface 1a.

The substrate 1 may be a ceramic wiring board made of a ceramic material. Examples of the ceramic material used for the ceramic wiring board include sintered aluminum oxide, sintered mullite, sintered silicon carbide, sintered aluminum nitride, and sintered glass ceramic. The ceramic wiring board may include conductors such as connection pads, internal wiring conductors, and external connection terminals for electrical connection between the light emitters 20 and an external circuit. The ceramic wiring board may be a stack.

The substrate 1 may be an organic wiring board made of an organic material. The organic wiring board may be a printed wiring board, a build-up wiring board, or a flexible wiring board. Examples of the organic material used for the organic wiring board include an epoxy resin, a polyimide resin, a polyester resin, an acrylic resin, a phenolic resin, and a fluororesin. The organic wiring board may be a stack.

The substrate 1 may be made of, for example, a compound semiconductor. Examples of the material used for the substrate made of the compound semiconductor include silicon (Si), germanium (Ge), gallium (Ga), arsenic (As), indium (In), phosphorus (P), and sapphire ($Al_2O_3$).

The optical waveguide layer 5 may be made of glass such as quartz, or a resin such as polymethyl methacrylate or a fluororesin. The cladding 3 and the core 4 in the optical waveguide layer 5 may be made of glass or a resin. In some embodiments, one of the cladding 3 or the core 4 may be made of glass and the other may be made of a resin. The core 4 has a higher refractive index than the cladding 3. The optical waveguide layer 5 totally internally reflects light propagating through the core 4 using the cladding 3 and the core 4 with different refractive indexes. The optical waveguide layer 5 includes a path made of a material with a higher refractive index and surrounded by a material with a lower refractive index. The optical waveguide layer 5 can thus confine light inside the core 4 with the higher refractive index. Light propagates through the core 4 while being totally internally reflected repeatedly from the boundary between the core 4 and the cladding 3.

As illustrated in, for example, FIG. 5, the cladding 3 may include a lower cladding layer 31 and an upper cladding layer 32 stacked on each other. The core 4 may extend between the lower cladding layer 31 and the upper cladding layer 32. The upper cladding layer 32 may include, on its upper surface opposite to the lower surface facing the lower cladding layer 31, a ridge 32a in conformance with the core 4.

In the optical waveguide layer 5, the cladding 3 and the core 4 may have a refractive index difference of 0.05 to 0.30 between them. In this case, the optical waveguide layer 5 can stably transmit light in a multi-mode. The core 4 may have a constant dimension (height) in the height direction (Z-direction). The core 4 may have a height of about 1 to 5 μm. The optical waveguide layer 5 can be formed using techniques similar to, for example, photolithography and etching used in the semiconductor device manufacturing process.

The core 4 includes a first waveguide 41, a second waveguide 42, and a third waveguide 43. The first waveguide 41 transmits light emitted from the first light emitter 21. The first waveguide 41 includes a first incident surface 41a that receives light emitted from the first light emitter 21. The first incident surface 41a faces a light emission surface of the first light emitter 21. The second waveguide 42 transmits light emitted from the second light emitter 22. The second waveguide 42 includes a second incident surface 42a that receives light emitted from the second light emitter 22. The second incident surface 42a faces a light emission surface of the second light emitter 22. The third waveguide 43 transmits light emitted from the third light emitter 23. The third waveguide 43 includes a third incident surface 43a that receives light emitted from the third light emitter 23. The third incident surface 43a faces a light emission surface of the third light emitter 23. The first waveguide 41, the second waveguide 42, and the third waveguide 43 may be hereafter collectively referred to as waveguides 40.

The core 4 further includes a merging portion 44 and an emission portion 46. At least two of the first waveguide 41, the second waveguide 42, or the third waveguide 43 merge in the merging portion 44. The emission portion 46 is located at one end of the merging portion 44. As illustrated in, for example, FIGS. 1 to 4, the emission portion 46 is located at one end of the merging portion 44 opposite to the waveguides 40. Light beams emitted from the light emitters 20 are combined in the merging portion 44 and are emitted outside through the emission portion 46.

At least two waveguides merging in the merging portion 44 each include an incident portion 40a as a first portion and a pre-merging portion 40b as a second portion. The incident portion 40a receives light (also referred to as a beam) emitted from the corresponding light emitter. The incident portion 40a may have a constant width (or a fixed width). The incident portion 40a may have a length of about 50 to 600 μm. The length of each portion of the waveguides 40 herein refers to the length in the direction of light propagation. The width of each portion of the waveguides 40 herein refers to the length perpendicular to the direction of light propagation in a plan view.

The pre-merging portion 40b is adjacent to the merging portion 44, or more specifically, connecting with the merging portion 44. The pre-merging portion 40b may be upstream from and adjacent to the merging portion 44 or be a surface connecting with the merging portion 44. At least two waveguides merging in the merging portion 44 may include the pre-merging portions 40b with the same width. In this case, light beams from at least two waveguides merging in the merging portion 44 uniformly enter the merging portion 44. To shape the combined light beams, the pre-merging portions 40b in at least two waveguides merging in the merging portion 44 may have different widths.

The light source module 100 includes the incident portions 40a with a greater width than the pre-merging portions 40b. Each incident portion 40a may have a width of about 5 to 10 µm or about 7 µm. Each pre-merging portion 40b may have a width of about 1.5 to 5 µm or about 3 µm. The wider incident portion 40a has a greater tolerance in a direction orthogonal to the central axis of the incident portion 40a and along the first surface 1a of the substrate 1 when the corresponding light emitter 20 is mounted on the substrate 1. This allows light emitted from the light emitters 20 to efficiently enter at least two waveguides. The narrower pre-merging portion 40b allows a beam entering the incident portion 40a to be shaped (e.g., a Gaussian beam with high beam characteristics) for projection onto, for example, a screen or other surfaces before entering the merging portion 44.

At least two waveguides merging in the merging portion 44 may include a third portion 40c (also referred to as a tapered waveguide portion) between the incident portion 40a and the pre-merging portion 40b in the direction of light propagation. The tapered waveguide portion 40c may have a width gradually decreasing toward the pre-merging portion 40b. The tapered waveguide portion 40c may have the same width as the incident portion 40a at its end adjacent to the incident portion 40a, and the same width as the pre-merging portion 40b at its end adjacent to the pre-merging portion 40b. The incident portion 40a has a constant width, whereas the tapered waveguide portion 40c nearer the emission portion 46 than the incident portion 40a has a tapered width. This structure reduces the likelihood that a beam emitted through the emission portion 46 has an unstable shape resulting from misalignment between the emission surface of each light emitter 20 and the incident surface of the corresponding waveguide 40.

At least two waveguides merging in the merging portion 44 each include the tapered waveguide portion 40c, and thus each have a cross-sectional area gradually decreasing on a plane perpendicular to the direction of light propagation. At least two waveguides merging in the merging portion 44 can reduce possible phase variations in beams from the light emitters 20 entering the incident portions 40a, thus allowing propagation of the beams with the same phase.

The merging portion 44 may include a fourth portion (also referred to as a tapered merging portion) 44a. The tapered merging portion 44a may be adjacent to at least two waveguides merging in the merging portion 44. The tapered merging portion 44a may have a width gradually decreasing toward the emission portion 46. As illustrated in, for example, FIG. 7, the tapered merging portion 44a may be symmetric with respect to a central axis CA of the tapered merging portion 44a. With this structure, light beams from at least two waveguides merging in the merging portion 44 uniformly enter the tapered merging portion 44a and efficiently propagate through the tapered merging portion 44a. The tapered merging portion 44a has a cross-sectional area gradually decreasing on a plane perpendicular to the direction of light propagation. This reduces possible phase variations in beams entering the tapered merging portion 44a, thus allowing propagation of the beams with the same phase.

The tapered merging portion 44a may be, for example, isosceles trapezoidal, or substantially isosceles trapezoidal in a plan view. The tapered merging portion 44a may have a width of about 4 to 30 µm or about 6 to 9 µm at its end adjacent to the waveguides 40. The tapered merging portion 44a may have a width of about 1.5 to 5 µm or about 3 µm at its end adjacent to the emission portion 46. The tapered merging portion 44a may have a length of about 100 to 600 µm or about 150 to 350 µm.

The merging portion 44 may include a fifth portion (also referred to as a pre-emission portion) 44b. The pre-emission portion 44b may be between the tapered merging portion 44a and the emission portion 46. The pre-emission portion 44b may have a constant width. The pre-emission portion 44b with a fixed width is less likely to cause variations in the beam phase. The light source module 100 can thus emit a beam suitable for projection onto, for example, a screen. The pre-emission portion 44b may have a width of about 1.5 to 5 µm or about 3 µm.

As illustrated in, for example, FIG. 3, the cladding 3 may include a second surface 3a that is a lower surface facing the substrate 1 and a third surface 3b that is an upper surface opposite to the second surface 3a. The cladding 3 may include three through-holes 33 extending from the third surface 3b through the second surface 3a. The first light emitter 21, the second light emitter 22, and the third light emitter 23 may be received in the respective three through-holes 33 as illustrated in, for example, FIG. 1. The through-holes 33 may be sized to receive the first to third light emitters 21, 22, and 23, and thus to have minimum openings. This increases the rigidity of the cladding 3 and reduces deformation of the cladding 3 and the core 4 in the cladding 3. In particular, the inner side surfaces of the through-holes 33 including the incident surfaces 41a, 42a, and 43a of the core 4 have less deformation, thus allowing light emitted from the first to third light emitters 21, 22, and 23 to efficiently enter the core 4. As illustrated in, for example, FIG. 4, the through-holes 33 may be sized and shaped to fit the profiles of the first to third light emitters 21, 22, and 23. The first to third light emitters 21, 22, and 23 are simply placed into the corresponding through-holes 33 for easy positioning.

The through-holes 33 may be replaced by a single through-hole 34 as illustrated in, for example, FIG. 9, rather than being formed for the respective emitters. The first light emitter 21, the second light emitter 22, and the third light emitter 23 may all be received in the single through-hole 34. The single through-hole 34 may have an opening including the openings of the three through-holes 33. This structure reduces the likelihood that each light emitter 20 strikes against the opening edge or the inner peripheral surface of the through-hole 34 when the light emitter 20 is mounted on the substrate 1, facilitating the process for mounting the light emitters 20. The first incident surface 41a, the second incident surface 42a, and the third incident surface 43a can be at the same positions in the through-holes 33 for the respective emitters and also in the single through-hole 34. For the through-holes 33 for the respective emitters, as illustrated in, for example, FIG. 8, at least either the width (in Y-direction in the figure) or the length (in X-direction in the figure) of each through-hole 33 may be greater than the corresponding dimension of the light emitter 20. This reduces the likelihood that each light emitter 20 strikes against the opening edge or the inner peripheral surface of the corresponding through-hole 33 when the light emitter 20 is mounted on the substrate 1. In this case as well, the cladding 3 has higher rigidity than in the structure with a larger single through-hole 34.

As illustrated in, for example, FIGS. 1 and 3, the light source module 100 may further include a lid 6, a seal ring 7, and a condenser lens 8.

The lid 6 is located above the third surface 3b of the cladding 3 and covers the first light emitter 21, the second light emitter 22, and the third light emitter 23. The seal ring 7 is between the lid 6 and the cladding 3. The seal ring 7 is a continuous loop surrounding the openings of all the three through-holes 33 in a plan view. The seal ring 7 improves the airtightness of the space accommodating the light emitters 20.

The lid 6 may be directly joined to the cladding 3 by, for example, heating. However, the cladding 3 and the core 4 may deform under stress during heating. This may cause misalignment of the optical axes between the light emitters 20 and the core 4. The seal ring 7 surrounding the through-holes 33 increases the mechanical strength around the through-holes 33 and reduces deformation of the cladding 3 and the core 4. This reduces misalignment of the optical axes between the light emitters 20 and the core 4. This structure is also usable for the cladding 3 including the single through-hole 34 to more noticeably reduce deformation of the cladding 3 and the core 4.

The lid 6 may be made of, for example, a glass material such as quartz, borosilicate glass, or sapphire. The lid 6 may be made of a compound semiconductor such as silicon, a metal such as Fe, Ni, or Co, or an alloy of any of these metals. The seal ring 7 may be made of, for example, a metal such as Ti, Ni, Au, Pt, or Cr or an alloy of any of these metals. The seal ring 7 is fixed to the third surface 3b of the cladding 3 by, for example, vapor deposition, sputtering, ion plating, or plating. The lid 6 may be joined to the seal ring 7 by, for example, thermal curing or laser welding using a bond, such as Au—Sn or Sn—Ag—Cu solder, a metal nanoparticle paste of, for example, Ag or Cu, or a glass paste.

The seal ring 7 may be located on the lid 6, rather than on the cladding 3, in a portion facing the cladding 3. The seal ring 7 may be made of, for example, a metal such as Ti, Ni, Au, Pt, or Cr or an alloy of any of these metals. The seal ring 7 may be fixed to the lid 6 by, for example, vapor deposition, sputtering, ion plating, or plating. The cladding 3 may be joined to the seal ring 7 by, for example, thermal curing or laser welding using a bond, such as Au—Sn or Sn—Ag—Cu solder, a metal nanoparticle paste of, for example, Ag or Cu, or a glass paste.

The seal ring 7 may be located on each of the cladding 3 and the lid 6. The seal ring 7 on the cladding 3 and the seal ring 7 on the lid 6 may be joined together by, for example, thermal curing or laser welding using a bond, such as Au—Sn or Sn—Ag—Cu solder, a metal nanoparticle paste of Ag or Cu, or a glass paste. The cladding 3 and the lid 6 may be joined together with high airtightness without any seal ring 7.

The condenser lens 8 is located on the optical path of light emitted through the emission portion 46. The condenser lens 8 may collimate light emitted through the emission portion 46 or condense light emitted through the emission portions 46. As illustrated in, for example, FIG. 3, the condenser lens 8 may be a plano-convex lens with an incident surface facing the emission portion 46 being flat and an emission surface being convex.

The light source module 100 further includes multiple electrodes 9 for providing a drive current to the light emitters 20. In the present embodiment, two electrodes 9 are located for each of the first light emitter 21, the second light emitter 22, and the third light emitter 23 as illustrated in, for example, FIGS. 1, 2, and 4. The two electrodes 9 may be two parallel wiring strips arranged on the first surface 1a of the substrate 1. In a plan view, each wiring strip may have one end located in an area surrounded by the inner peripheral surface of the corresponding through-hole 33 in the first surface 1a, and the other end exposed from the cladding 3 in the first surface 1a. Each wiring strip has one end electrically connected to the electrode (positive electrode or negative electrode) of the corresponding light emitter 20, and the other end electrically connected to an external power circuit.

The present disclosure may be implemented in the following forms.

In one or more embodiments of the present disclosure, a light source module 100 includes a first light emitter 21 that emits light with a first wavelength, a second light emitter 22 that emits light with a second wavelength different from the first wavelength, and a third light emitter 23 that emits light with a third wavelength different from the first wavelength and the second wavelength, a cladding 3, and a core 4 in the cladding 3. The core 4 includes a first waveguide 41 that transmits light emitted from the first light emitter 21, a second waveguide 42 that transmits light emitted from the second light emitter 22, a third waveguide 43 that transmits light emitted from the third light emitter 23, a merging portion 44 in which at least two waveguides 40 of the first waveguide 41, the second waveguide 42, or the third waveguide 43 merge, and an emission portion 46 at one end of the merging portion 44. Each of the at least two waveguides 40 includes a first portion 40a that receives incident light and a second portion 40b adjacent to the merging portion 44. The first portion 40a has a greater width than the second portion 40b.

In one or more embodiments of the present disclosure, the light source module 100 can efficiently allow light emitted from the light emitters 20 to enter the waveguides 40.

Although embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

REFERENCE SIGNS 100 light source module
1 substrate
1a one main surface (first surface)
3 cladding
3a lower surface (second surface)
3b upper surface (third surface)
4 core
5 optical waveguide layer
6 lid
7 seal ring
8 condenser lens
9 electrode
20 light emitter
21 first light emitter
22 second light emitter
23 third light emitter
31 lower cladding layer
32 upper cladding layer
32a ridge
33, 34 through-hole
40 waveguide
40a first portion (incident portion)
40b second portion (pre-merging portion)
40c third portion (tapered waveguide portion)
41 first waveguide
41a first incident surface
42 second waveguide
42a second incident surface 43 third waveguide
43a third incident surface
44 merging portion
44a fourth portion (tapered merging portion)
44b fifth portion (pre-emission portion)
46 emission portion

The invention claimed is:

1. A light source module, comprising:
a first light emitter configured to emit light with a first wavelength;
a second light emitter configured to emit light with a second wavelength different from the first wavelength;
a third light emitter configured to emit light with a third wavelength different from the first wavelength and the second wavelength;
a cladding; and
a core in the cladding, the core having a constant height, including
a first waveguide configured to transmit light emitted from the first light emitter,
a second waveguide configured to transmit light emitted from the second light emitter,
a third waveguide configured to transmit light emitted from the third light emitter,
a merging portion in which at least two waveguides of the first waveguide, the second waveguide, or the third waveguide merge, and
an emission portion at one end of the merging portion,
wherein each of the at least two waveguides includes a first portion configured to receive incident light and a second portion adjacent to the merging portion, and the first portion has a greater width than the second portion.

2. The light source module according to claim 1, further comprising:
a substrate including a first surface, the substrate receiving the first light emitter, the second light emitter, the third light emitter, and the cladding on the first surface;
a lid above the first surface, the lid covering the first light emitter, the second light emitter, and the third light emitter; and
a condenser lens on an optical path of light emitted through the emission portion.

3. The light source module according to claim 2, wherein the cladding includes a second surface facing the substrate, a third surface opposite to the second surface, and three through-holes extending from the second surface through the third surface, and
the first light emitter, the second light emitter, and the third light emitter are received in the respective three through-holes.

4. The light source module according to claim 1, wherein a width of the second portion of one of the at least two waveguides differs from a width of the second portion of another one of the at least two waveguides.

5. The light source module according to claim 1, wherein the first portion is a straight shape.

6. The light source module according to claim 1, wherein the first portion of each of the at least two waveguides has a constant width.

7. The light source module according to claim 1, wherein each of the at least two waveguides includes a third portion between the first portion and the second portion, and the third portion has a width gradually decreasing toward the second portion.

8. The light source module according to claim 7, wherein one end of the first portion is equal in width to one end of the third portion.

9. The light source module according to claim 1, wherein the merging portion includes a fourth portion adjacent to the at least two waveguides, and the fourth portion is symmetric with respect to a central axis of the fourth portion and has a width gradually decreasing toward the emission portion.

10. The light source module according to claim 9, wherein the merging portion includes a fifth portion between the fourth portion and the emission portion, and the fifth portion has a constant width.

11. A light source module, comprising:
a first light emitter configured to emit light with a first wavelength;
a second light emitter configured to emit light with a second wavelength different from the first wavelength;
a third light emitter configured to emit light with a third wavelength different from the first wavelength and the second wavelength;
a cladding; and
a core in the cladding, the core including
a first waveguide configured to transmit light emitted from the first light emitter,
a second waveguide configured to transmit light emitted from the second light emitter,
a third waveguide configured to transmit light emitted from the third light emitter,
a merging portion in which at least two waveguides of the first waveguide, the second waveguide, or the third waveguide merge, and
an emission portion at one end of the merging portion,
wherein each of the at least two waveguides includes a first portion configured to receive incident light and a second portion adjacent to the merging portion, and the first portion has a greater width than the second portion, and
each of the at least two waveguides includes a third portion between the first portion and the second portion, and the third portion has a width gradually decreasing toward the second portion.

12. The light source module according to claim 11, wherein
the merging portion includes a fourth portion adjacent to the at least two waveguides, and the fourth portion is symmetric with respect to a central axis of the fourth portion and has a width gradually decreasing toward the emission portion.

13. The light source module according to claim 12, wherein
the merging portion includes a fifth portion between the fourth portion and the emission portion, and the fifth portion has a constant width.

14. The light source module according to claim 11, wherein the first portion of each of the at least two waveguides has a constant width.

15. The light source module according to claim 11, wherein the core has a constant height.

16. The light source module according to claim 11, further comprising:
a substrate including a first surface, the substrate comprising the first light emitter, the second light emitter, the third light emitter, and the cladding on the first surface;
a lid above the first surface, the lid covering the first light emitter, the second light emitter, and the third light emitter; and
a condenser lens on an optical path of light emitted through the emission portion.

17. The light source module according to claim 16, wherein
- the cladding includes a second surface facing the substrate, a third surface opposite to the second surface, and three through-holes extending from the second surface through the third surface, and
- the first light emitter, the second light emitter, and the third light emitter are in the respective three through-holes.

18. The light source module according to claim 11, wherein the first portion is straight shape.

19. The light source module according to claim 11, wherein
- each of the at least two waveguides includes a third portion between the first portion and the second portion, and the third portion has a width gradually decreasing toward the second portion.

20. The light source module according to claim 19, wherein one end of the first portion is equal in width to one end of the third portion.

* * * * *